United States Patent [19]

Sawaya

[11] Patent Number: 5,352,632
[45] Date of Patent: Oct. 4, 1994

[54] MULTICHIP PACKAGED SEMICONDUCTOR DEVICE AND METHOD FOR MANUFACTURING THE SAME

[75] Inventor: Hiromichi Sawaya, Kawasaki, Japan

[73] Assignee: Kabushiki Kaisha Toshiba, Kawasaki, Japan

[21] Appl. No.: 62,013

[22] Filed: May 17, 1993

Related U.S. Application Data

[62] Division of Ser. No. 829,388, Feb. 3, 1992, Pat. No. 5,245,215.

[30] Foreign Application Priority Data

Feb. 8, 1991 [JP] Japan .................................. 3-018027
Jan. 11, 1992 [JP] Japan .................................. 4-021857

[51] Int. Cl.$^5$ .................................. H01L 21/60
[52] U.S. Cl. .................................. 437/209; 437/211; 437/214; 437/217
[58] Field of Search ............... 437/209, 211, 212, 214, 437/215, 217, 220

[56] References Cited

U.S. PATENT DOCUMENTS

| | | | |
|---|---|---|---|
| 4,264,917 | 4/1981 | Ugon | 437/217 |
| 4,709,468 | 12/1987 | Wilson | 357/75 |
| 4,755,866 | 7/1988 | Marshall et al. | 357/74 |
| 4,994,411 | 2/1991 | Naito et al. | 437/219 |
| 5,032,542 | 7/1991 | Kazami et al. | 437/220 |
| 5,034,350 | 7/1991 | Marchisi | 437/217 |
| 5,084,753 | 1/1992 | Goida et al. | 357/65 |
| 5,096,852 | 3/1992 | Hobson | 437/220 |
| 5,138,436 | 8/1992 | Koepf | 357/75 |
| 5,188,984 | 2/1993 | Nishiguchi | 437/214 |

FOREIGN PATENT DOCUMENTS

2-121343 5/1990 Japan .

OTHER PUBLICATIONS

Nikkei Microdevices, pp. 95–101 (Feb., 1989).

Primary Examiner—Tom Thomas
Assistant Examiner—Kevin M. Picardat
Attorney, Agent, or Firm—Finnegan, Henderson Farabow, Garrett & Dunner

[57] ABSTRACT

A plurality of semiconductor chips are mounted on a plurality of islands formed on a lead frame. Inner lead portions of the lead frame and electrode pads formed on the semiconductor chips are electrically connected to one another via first lead portions formed on a flexible resin tape and the electrode pads formed on the semiconductor chips are connected to one another via second lead portions formed on the flexible resin tape. The flexible resin tape on which the islands and inner lead portions of the lead frame, the plurality of semiconductor chips and the first and second lead portions are formed is sealed into a resin package.

8 Claims, 16 Drawing Sheets

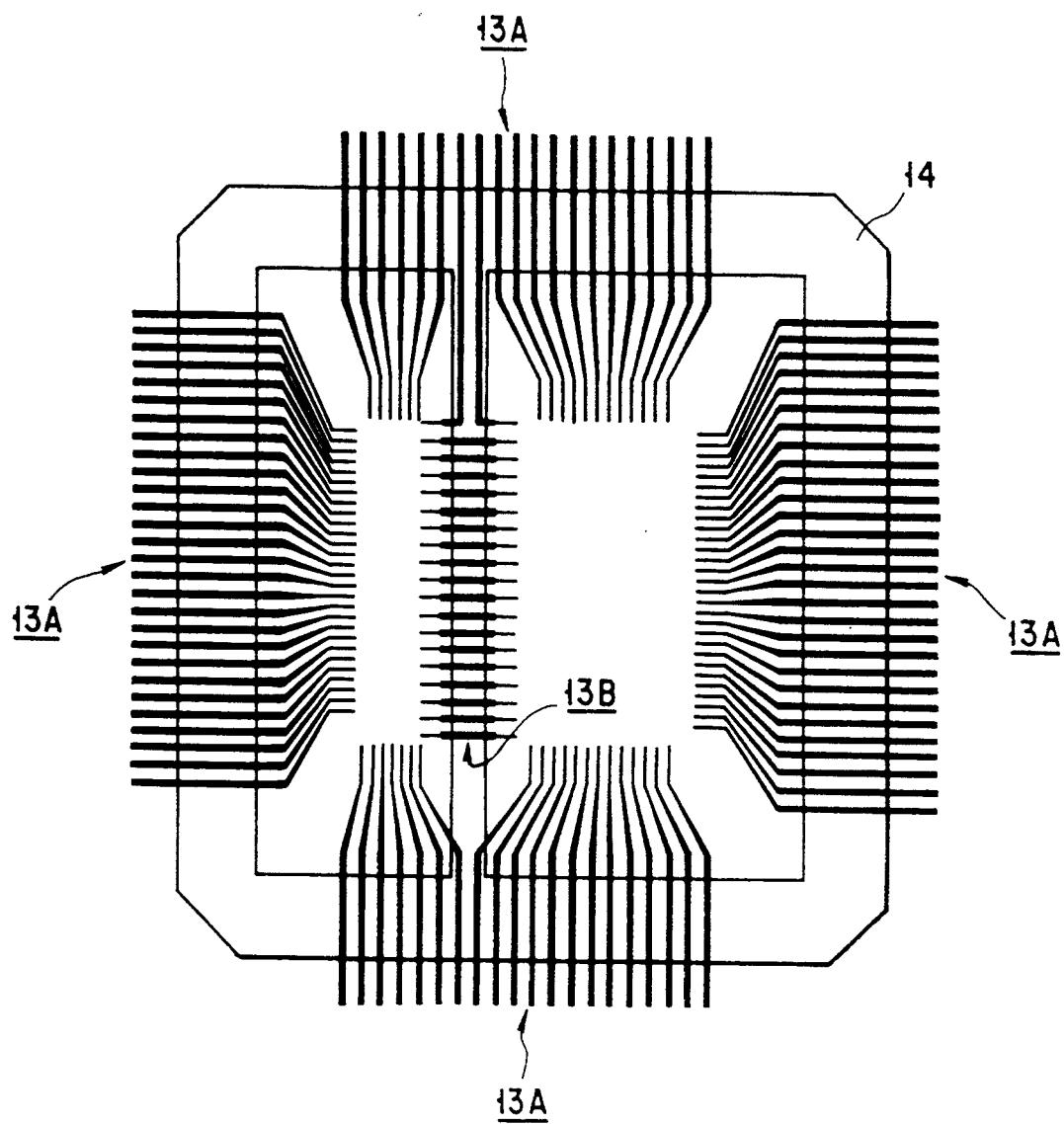
F I G. 3

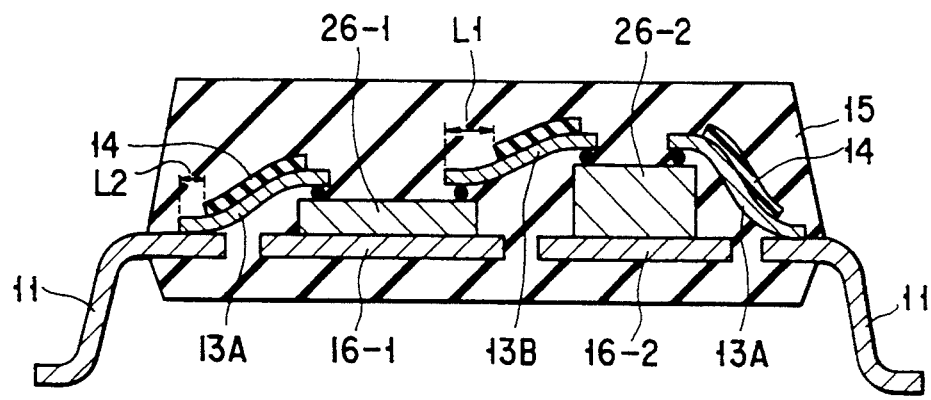
F I G. 4
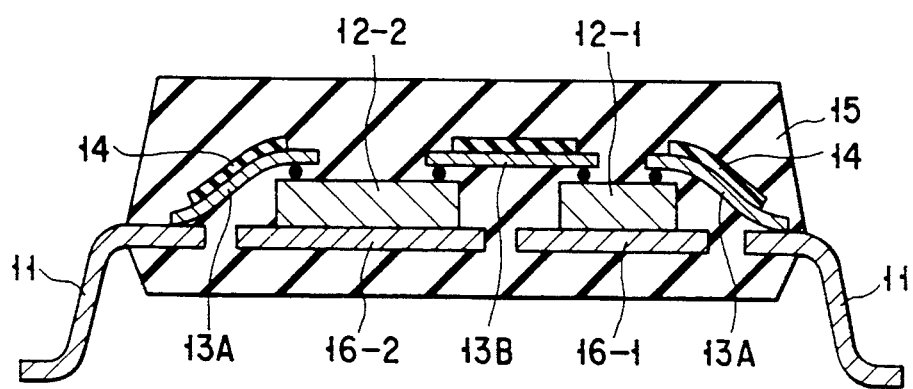
F I G. 5A

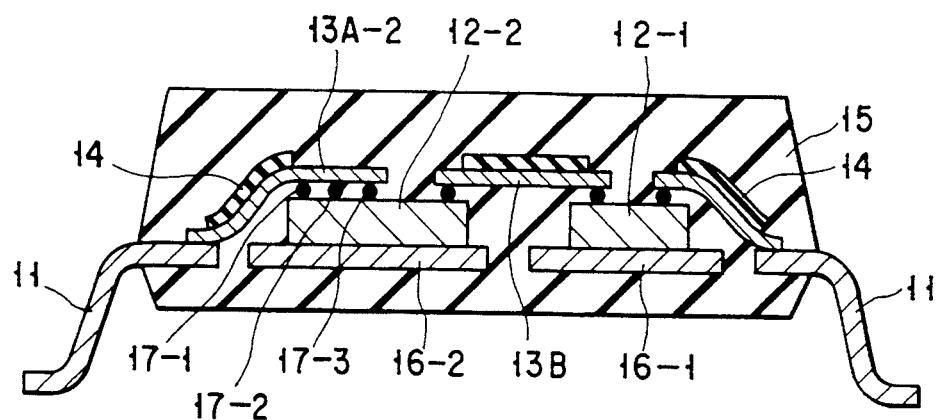
F I G. 6
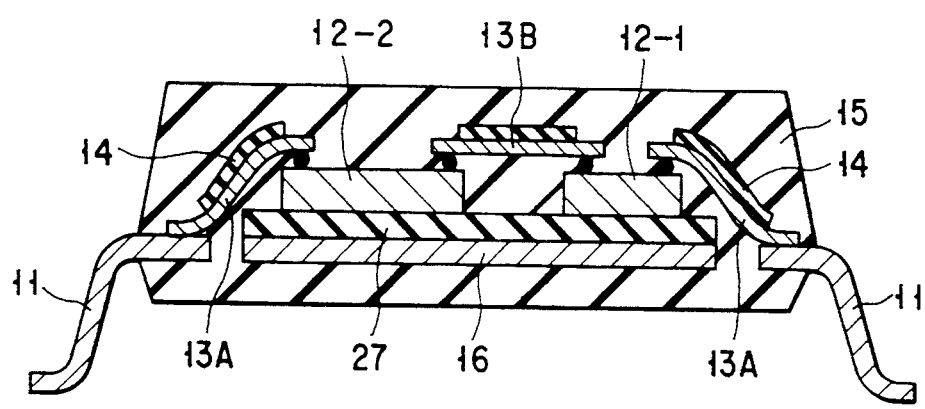
F I G. 7

MULTICHIP PACKAGED SEMICONDUCTOR DEVICE AND METHOD FOR MANUFACTURING THE SAME

This is a division of application Ser. No. 07/829,388, filed Feb. 3, 1992 now U.S. Pat. No. 5,245,215.

BACKGROUND OF THE INVENTION

1. Field of the Invention

This invention relates to a plastic packaged semiconductor device, and more particularly to a multichip packaged semiconductor device having a plurality of LSI chips or discrete semiconductor elements transfer-molded in a single package and a method for manufacturing the same.

2. Description of the Related Art

In recent years, considerable attention has been paid to a multichip packaged semiconductor device having a plurality of LSI chips or discrete semiconductor elements which are molded in a single package having a particular shape or the same shape as that of a standard integrated circuit device in order to enhance the density and miniaturize the semiconductor device. The packaged semiconductor device is briefly called a multichip package (MCP), and it can be used in combination with the conventional LSI chips or discrete semiconductor elements and the conventional manufacturing device and testing device for effecting the LSI manufacturing process and testing process can be used. Therefore, the turn around time (TAT) taken for forming a plurality of integrated circuits into one chip when developing new integrated circuits can be made short and the development cost can be made low. Further, since the conventional LSIs and discrete semiconductor devices are used, the package can be dealt with in the same manner as in the prior art case. In addition, in the MCP, it is only required to newly develop lead frames, and since the outer lead section having the same shape as that arranged in the package line-up can be used, it is only necessary to design the inner lead section of the lead frame. For this reason, the package is suitable for the custom IC, and the custom IC can be manufactured in a shorter TAT than in a case wherein a hybrid IC or the like is manufactured.

The inventor of this application developed the technique of manufacturing multichip packaged semiconductor devices by mounting a plurality of LSI chips or discrete semiconductor elements on a lead frame and sealing them into a single package by the transfer molding and commercialized the multichip packaged semiconductor devices. The multichip packaging technique is disclosed in detail in "NIKKEI MICRODEVICES" February, 1989, pp 95 to 101 a thesis written by the inventor and some of his colleagues. Further, the inventor of this application filed a U.S. patent application (U.S. patent application Ser. No. 07/506,251) relating to the multichip packaging technique and received an allowance thereof on Aug. 9, 1991.

As the integration density of the semiconductor device such as IC or LSI becomes higher, the number of electrode pads for supplying input signals and power source voltages or outputting output signals is increased, the power consumption is also increased, and the operation speed is made higher. When the electrode pads connected to bonding wires are arranged at a higher density on a chip with an increase in the integration density of the semiconductor device, the bonding tool will come into contact with adjacent bonding wires at the same time, thereby making it impossible to attain correct bonding. Further, since the size of the electrode pad and the electrode pad pitch cannot be made less than a certain value even if the semiconductor elements can be miniaturized, the chip size comes to have a limitation and the signal wiring length cannot be reduced on the chip.

In order to solve the above problem, the tape automated bonding (TAB) technique using a tape carrier is proposed. The TAB technique is a method effected by forming a device hole in a long flexible resin film, disposing metal wirings formed of a plurality of leads around the device hole, and connecting the metal wirings to electrode pads of the chip via the projected electrodes (bumps) and it may be applied to a semiconductor device such as a GaAs integrated circuit which requires a high operation speed. The TAB technique is described in detail in the article by KENZO HATADA, MATSUSHITA Electric Industrial Co. "Introduction to TAB Technique" published from Industrial Research Committee, for example.

However, in the semiconductor device formed by using the TAB technique, it is possible to derive out electrodes from discrete chips, but since it is impossible to constitute circuits by making use of a plurality of chips, it cannot be applied to the MCP type semiconductor device described above. Further, since the tape carrier is not formed of material such as a lead frame with high heat conductivity and the thermal resistance is large and heat radiation efficiency is low, a severe limitation is imposed on the type of semiconductor device in which the TAB technique can be used. In addition, since the outer lead is mechanically weak, it becomes impossible to wrap the same after it is separated from the tape carrier, and it becomes necessary to prepare a specified mounting device on the user's side, thus lowering the flexibility thereof and raising the cost of the instrument using the TAB package.

Further, a technique for connecting an electrode pad of a chip to an inner lead section of a lead frame by use of the above TAB technique is disclosed in Japanese Patent Disclosure No. 2-121343. By using the technique disclosed in the above Japanese Patent Disclosure, some of the defects associated with the TAB technique can be eliminated, but the above Japanese Patent Disclosure discloses or suggests nothing about the application of the technique to the MCP type semiconductor device.

SUMMARY OF THE INVENTION

Accordingly, a first object of this invention is to provide a multichip packaged semiconductor device which can be mounted at a high density and a method for manufacturing the same.

A second object of this invention is to provide a multichip packaged semiconductor device which has a small thermal resistance and a high heat radiation efficiency and which can be applied to various types of semiconductor devices and a method for manufacturing the same.

A third object of this invention is to provide a multichip packaged semiconductor device which does not require use of a special mounting device on the user's side, which is highly flexible and which will not increase the cost of an instrument using the semiconductor device and a method for manufacturing the same.

A fourth object of this invention is to provide a multichip packaged semiconductor device which can be hermetically sealed and is highly reliable and a method for manufacturing the same.

A fifth object of this invention is to provide a multichip packaged semiconductor device in which the wiring can be made short so as to reduce the impedance component of the wiring and the electrical characteristics such as the operation speed can be improved and a method for manufacturing the same.

The above first to fifth objects of this invention can be attained by a semiconductor device comprising a lead frame having an inner lead section, an outer lead section and at least one island; a plurality of semiconductor chips formed on the island of the lead frame and each having an electrode pad and each having at least one semiconductor element formed therein; and a flexible resin tape having device holes formed in positions corresponding to mounting sections of the semiconductor chips and having a wiring pattern for electrically connecting the electrode pads of the semiconductor chips to the inner lead section of the lead frame.

Further, the above first to fifth objects of this invention can be attained by a semiconductor device manufacturing method comprising the steps of mounting a plurality of semiconductor chips on at least one island formed on a lead frame; disposing a flexible resin tape having a wiring pattern and a plurality of device holes on the lead frame; connecting one end of the wiring pattern formed on the flexible resin tape to electrode pads formed on the plurality of semiconductor chips; and connecting the other end of the wiring pattern formed on the flexible resin tape to an inner lead section of the lead frame.

Since leads of the inner lead section of the lead frame and the electrode pads formed on the semiconductor chips are connected by means of the wiring pattern formed on the flexible resin tape, the mounting can be effected at a higher density than in a case wherein the connection is made by use of the wire bonding. Further, since a circuit can be constructed by use of a plurality of semiconductor chips by connecting a plurality of semiconductor chips to one another via the wiring pattern formed on the flexible resin tape, a plastic packaged semiconductor device for the MCP can be realized by use of the TAB technique. A plurality of semiconductor chips are mounted on a plurality of islands formed of material with high heat conductivity so that the thermal resistance can be reduced, the heat radiation efficiency can be enhanced and the limitation imposed on the type of applicable semiconductor devices can be alleviated. Since the lead frame is used and the mechanical strength of the outer lead section is higher than in a case wherein the TAB technique is used, it becomes unnecessary to use a special mounting device on the user's side, the flexibility can be enhanced and the cost of an instrument using the semiconductor device will not be raised. The semiconductor chips are transfer-molded in a resin package so that the excellent hermetic sealing can be attained and the reliability thereof can be made high. Further, since a plurality of semiconductor chips can be connected together in substantially the linear form via the wiring pattern formed on the flexible resin tape, the wiring can be made short so as to reduce the impedance component and the electrical characteristic such as the operation speed can be enhanced.

Thus, according to this invention, a multichip packaged semiconductor device which can be mounted at a high density and a method for manufacturing the same can be provided and can be widely used in the industrial-consumer field.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a plan view for illustrating another method for manufacturing the semiconductor device of this invention;

FIG. 4 is a cross sectional view of a semiconductor device according to a second embodiment of this invention;

FIG. 5A is a cross sectional view for illustrating a semiconductor device according to a third embodiment of this invention;

FIG. 6 is a cross sectional view of a semiconductor device according to a fourth embodiment of this invention;

FIG. 7 is a cross sectional view of a semiconductor device according to a fifth embodiment of this invention;

DETAILED DESCRIPTION OF THE PREFERRED EMBODIMENTS

Figure 1A:
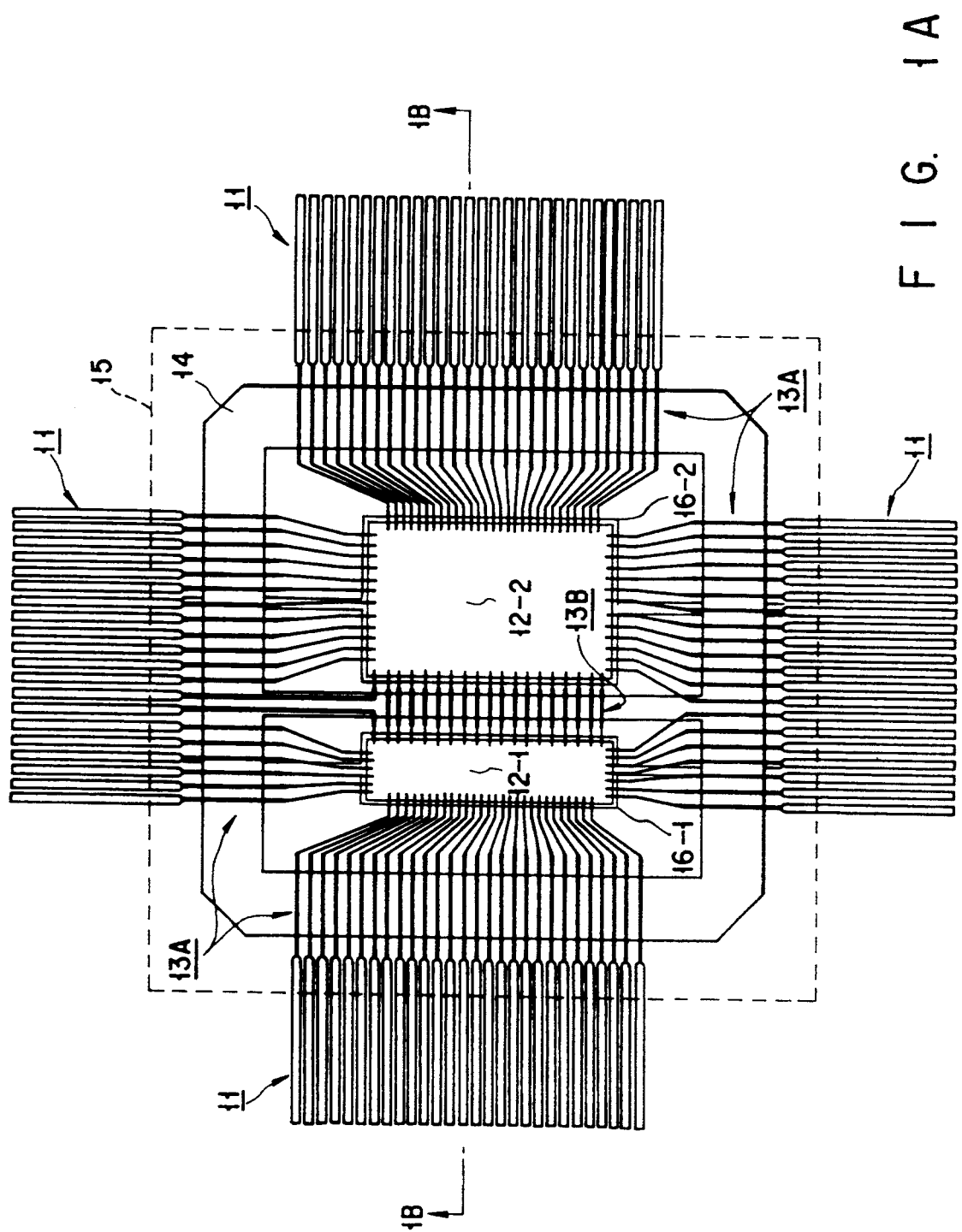
FIG. 1A is a plan view made in perspective of a package, for illustrating a semiconductor device according to a first embodiment of this invention.
Figure 1B:
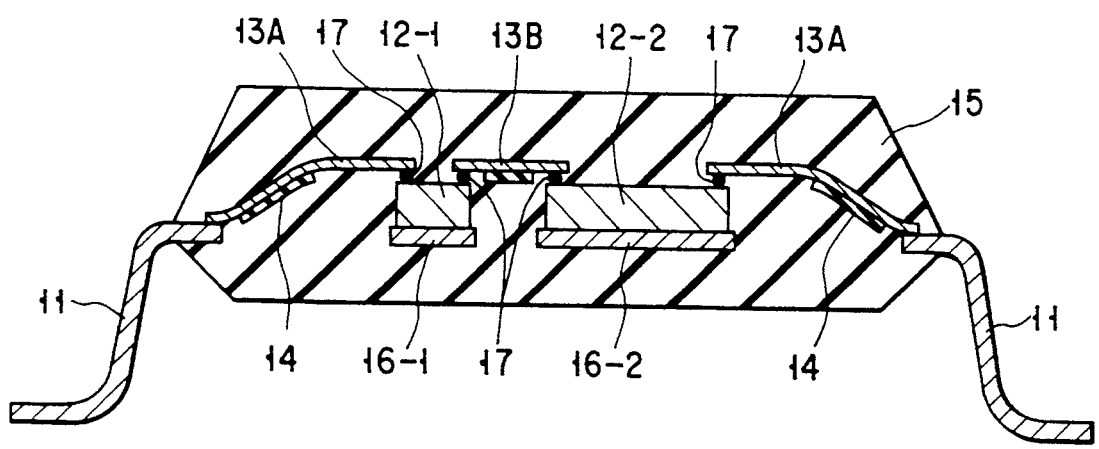
FIG. 1B is a cross sectional view taken along the line 1B—1B of the semiconductor device shown in FIG. 1A, for illustrating the semiconductor device according to the first embodiment of this invention.

FIGS. 1A and 1B show a multichip packaged semiconductor device according to a first embodiment of this invention. FIG. 1A is a plan view made in perspective of a package and FIG. 1B is a cross sectional view taken along the line 1B—1B of FIG. 1A. As shown in FIGS. 1A and 1B, the semiconductor device includes lead frames 11, LSI chips (or discrete semiconductor elements) 12-1 and 12-2, a flexible resin tape 14 having wiring patterns 13A and 13B and a resin package 15. Islands 16-1 and 16-2 are provided on the lead frame 11 and the LSI chips 12-1 and 12-2 are formed on the respective islands 12-1 and 12-2. In this embodiment, a tape carrier used in the TAB technique is used as the flexible resin tape 14. The wiring pattern formed on the resin tape 14 has the first lead section 13A for electrically connecting the inner lead portions of the lead frame 11 and the electrode pads on the chips 12-1 and 12-2 to one another and the second lead section 13B for electrically connecting the electrode pads on the chip 12-1 and the electrode pads on the chip 12-2 to one another. The resin tape 14 is called a face-up/polyimide-down type tape because the element forming faces of the chips 12-1 and 12-2 are set to face up and the wiring patterns 13A and 13B are formed on the resin tape 14 formed of polyimide. One-side ends of lead portions of the first lead section 13A are bonded to the respective inner lead portions of the lead frame 11 by alloy bonding and the other-side ends thereof are bonded to corresponding bumps 17 formed on the electrode pads of the chips 12-1 and 12-2. The chips 12-1 and 12-2 are electrically connected to each other by bonding the lead portions of the second lead section 13B to the bumps 17 formed on the chips 12-1 and 12-2. When the chips 12-1 and 12-2 are connected to each other, the electrode pads and the lead portions of the lead section 13B may be connected together by forming the resin tape 14 to extend over the electrode pads of the chips 12-1 and 12-2, forming through holes in portions of the tape 14 which lie on the electrode pads and forming bump electrodes in the through holes on the electrode pads.

The inner lead portions and islands 16-1 and 16-2 of the lead frame 11, the chips 12-1 and 12-2, the resin tape 14 and the wiring patterns 13A and 13B are sealed into a package 15 by transfer-molding. The front end portion of each of the outer lead portions of the lead frame 11 is bent in a horizontal direction so as to hold a main body (package 15) in space when it is mounted on a printed circuit board or the like. That is, the outer appearance of the plastic packaged semiconductor device is the surface mounting QFP (Quad Flat Package) type.

Figure 2A:
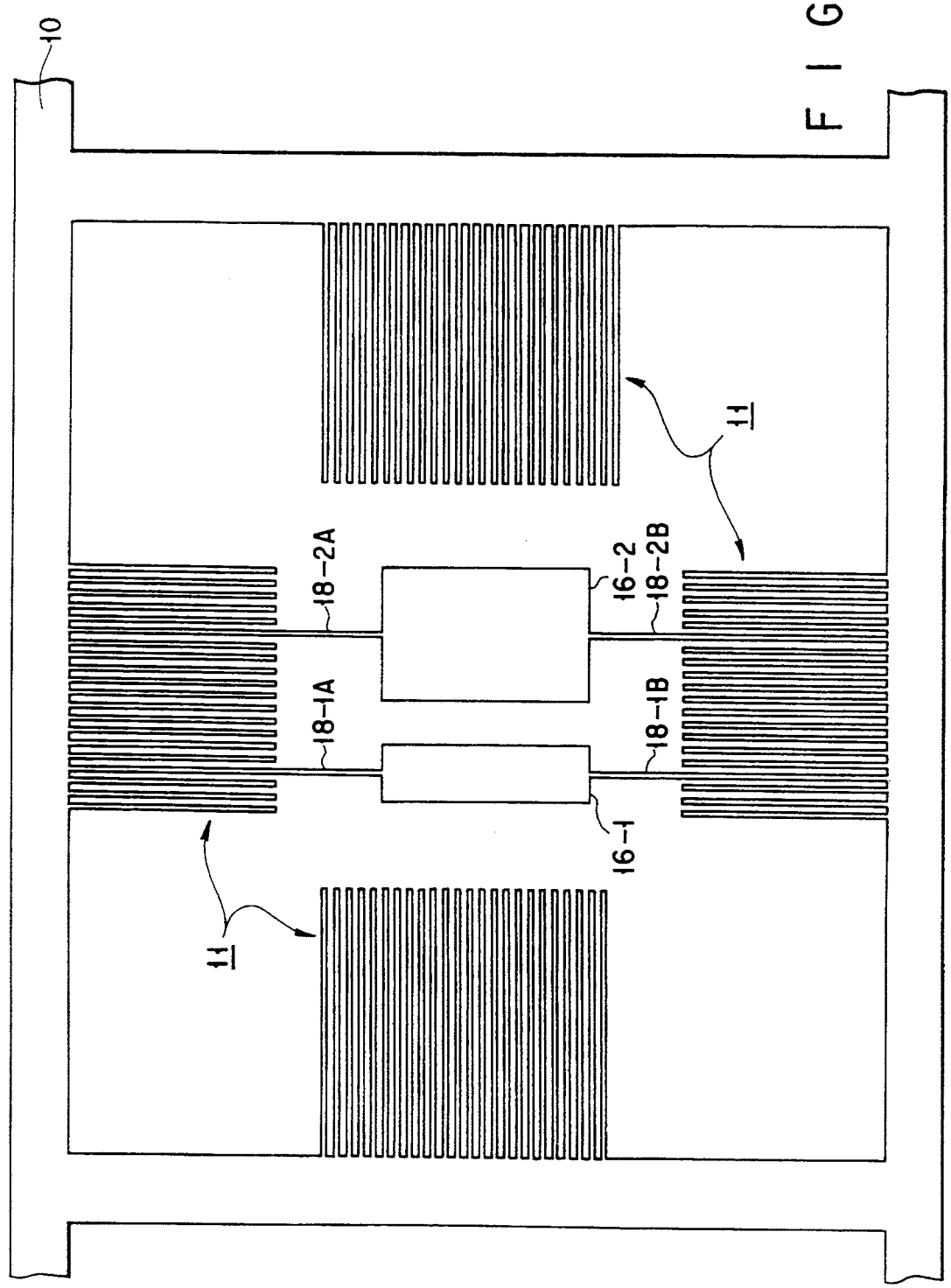
FIGS. 2A to 2E are plan views for illustrating a method for manufacturing the semiconductor device of this invention.

Next, a method for manufacturing the semiconductor device shown in FIGS. 1A and 1B is explained with reference to FIGS. 2A to 2E. FIGS. 2A to 2E show the manufacturing process in the order of the steps for manufacturing the semiconductor device. As shown in FIG. 2A, the lead frame 11 and islands 16-1 and 16-2 are formed by punching holes in a long metal plate. The metal plate may be formed of a material with high heat conductivity such as Cu alloy or Fe-42Ni alloy. The island 16-1 is supported on the frame 10 by means of tie bars 18-1A and 18-1B and the island 16-2 is supported on the frame 10 by means of tie bars 18-2A and 18-2B. The lead frames 11 are formed to extend in directions towards the islands 16-1 and 16-2 formed in the central portion. The shapes and sizes of the islands 16-1 and 16-2 are different in this embodiment but they may be formed with the same shape and size and the number of islands may be set to a desired value. Unlike the conventional lead frame for the MCP, a frame for supporting a lead for connecting the chips 12-1 and 12-2 to each other is not formed in the lead frame 11.

Figure 2B:
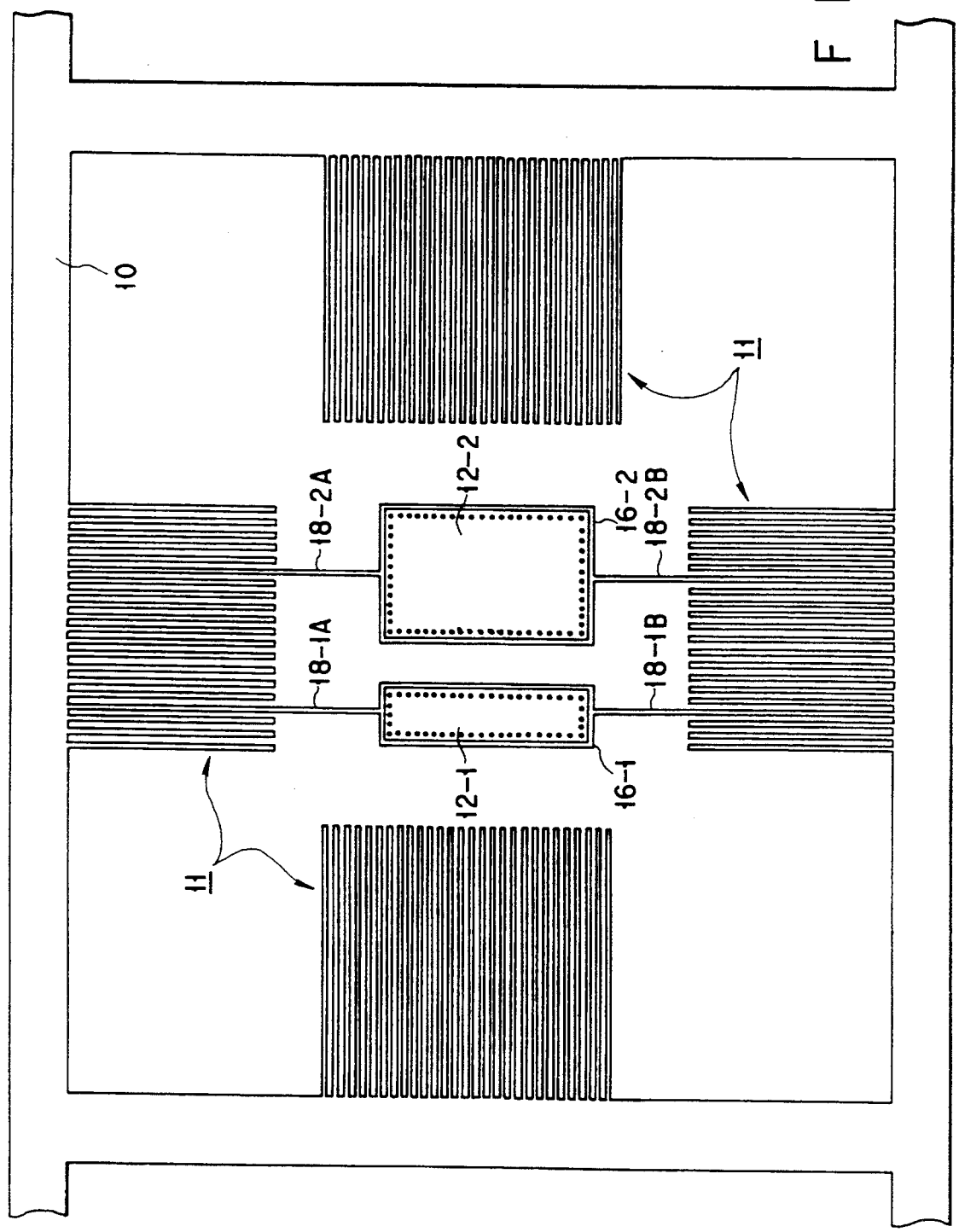

After this, as shown in FIG. 2B, the chips 12-1 and 12-2 are respectively mounted on the islands 16-1 and 16-2 by die-bonding using Ag-series material.

Figure 2C:
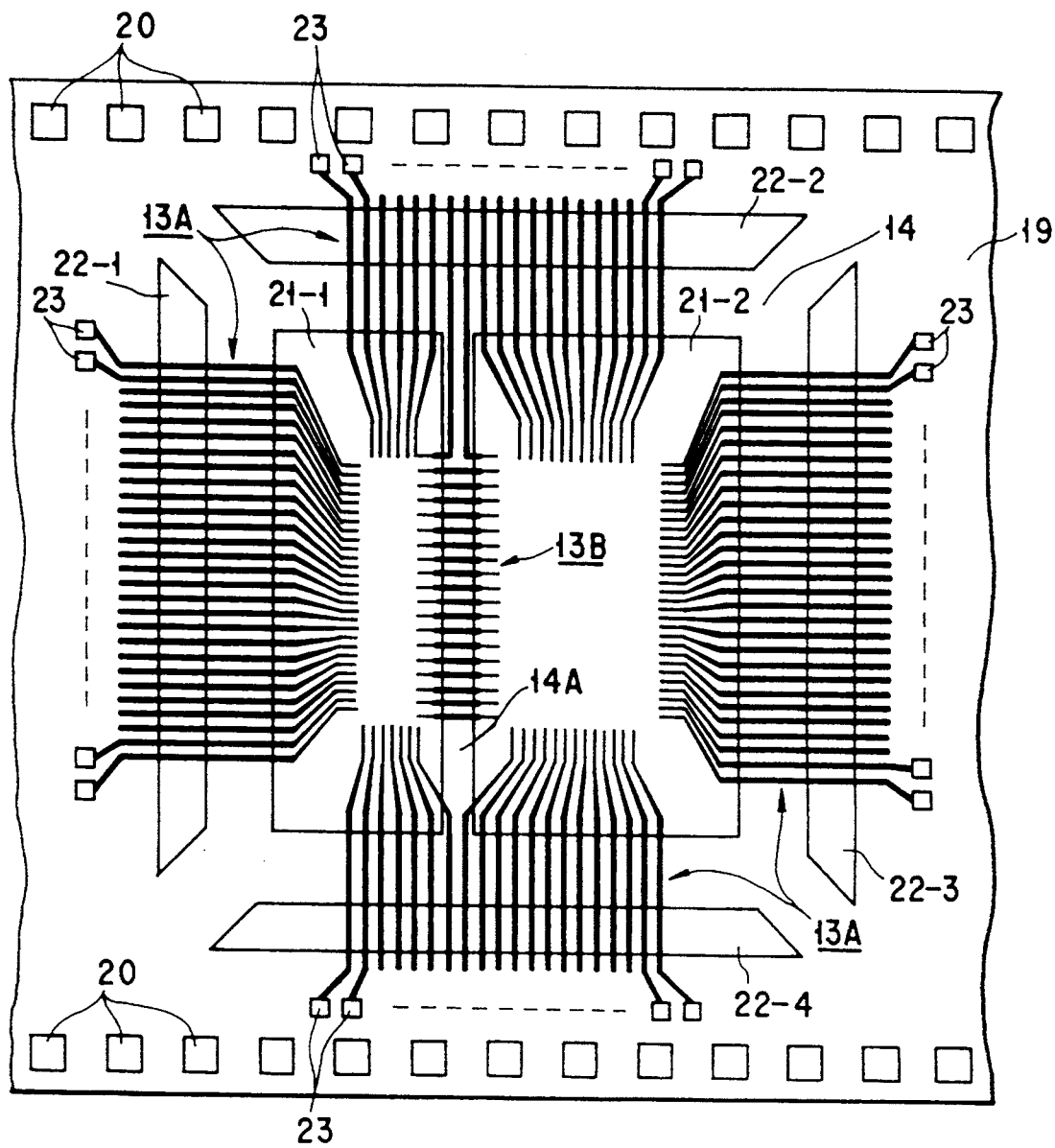

Next, the flexible resin tape 14 on which the wiring patterns 13A and 13B are formed is superposed on the lead frame 11 shown in FIG. 2B and bonded thereto and consequently the inner lead portions of the lead frame 11 and the electrode pads of the chips 12-1 and 12-2 are electrically connected and the electrode pads of the chips 12-1 and 12-2 are electrically connected to one another. As shown in FIG. 2C, the resin tape 14 has a long tape 19 as a base plate formed of polyimide or the like and is separated from the long tape 19. Feeding holes 20 for feeding the tape are formed at a regular interval in both side portions of the long tape 19. Further, device holes 21-1 and 21-2 are formed in the long tape 19 in positions corresponding to the chips 12-1 and 12-2. Outer lead holes 22-1 to 22-4 are formed 10 in portions around the device holes 2 -1 and 21-2 of the tape 19. A plurality of test pads 23 are formed outside the outer lead holes 22-1 to 22-4 and a wiring pattern is formed to extend from the pads 23 into areas of the device holes 21-1 and 21-2 so as to constitute the first lead section 13A. A wiring pattern is formed on a portion of the resin tape 14 which lies between the device holes 21-1 and 21-2 and formed to extend into an area of the device holes 21-1 and 21-2 so as to constitute the second lead section 13B.

Figure 2D:
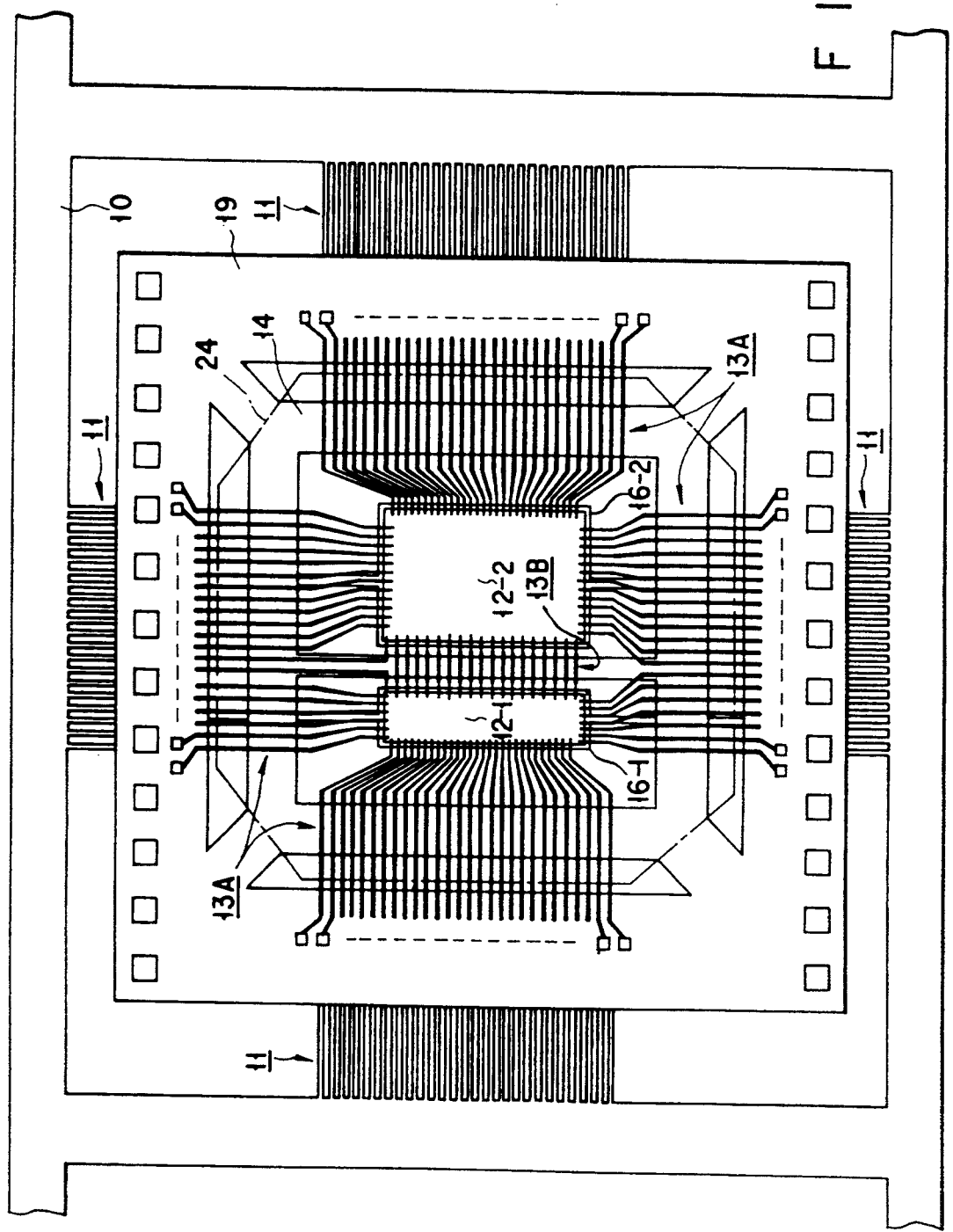

The long tape 19 shown in FIG. 2C is cut apart for each MCP and is superposed on the lead frame 11 shown in FIG. 2D. Then, portions of the wiring patterns 13A and 13B lying inside the device holes 21-1 and 21-2 are bonded to the electrode pads on the chips 12-1 and 12-2. After this, an unnecessary portion of the tape 19 is removed (the tape 19 is cut apart along a one-dot-dash line 24) and the other ends of the wiring patterns 13A are bonded to the inner lead portions of the lead frame 11.

Figure 2E:
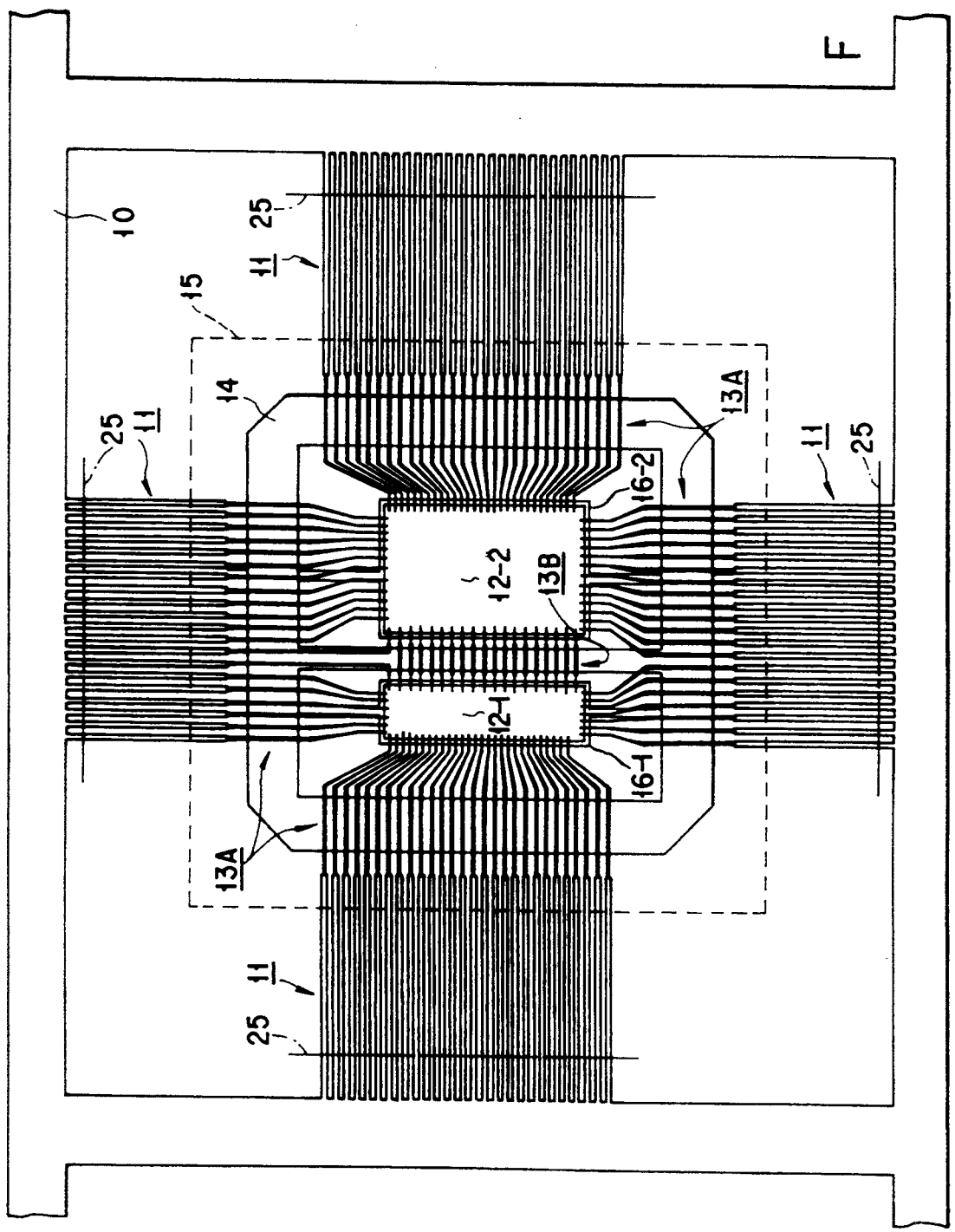

Next, as shown in FIG. 2E, the inner lead portions of the lead frame 11, islands 16-1 and 16-2, chips 12-1 and 12-2 and resin tape 14 are molded with resin such as epoxy resin by an adequate molding technique such as the transfer molding technique so as to form the package 15.

The following manufacturing process is effected in the same manner as in the conventional method of manufacturing the semiconductor device. That is, the outer lead portions are separated from the frame 10 at a portion indicated by a one-dot-dash line 25 shown in FIG. 2E and then the front end portions of the outer lead portions are bent into a suitable form so as to be easily fixed on a printed circuit board or the like, thus completing a semiconductor device.

As shown in FIG. 3, it is possible to previously cut apart the unnecessary peripheral portion of the long tape 19 at the one-dot-dash line 24, place the same on the lead frame 11 and effect the bonding in the step of FIG. 2D. In this case, one-side ends of the lead portions of the first lead section 13A are connected to the electrode pads (or bumps) of the chips 12-1 and 12-2 by use of a bonding tool and the electrode pads of the chips 12-1 and 12-2 are connected to one another via the second lead section 13B. Since the chips 12-1 and 12-2 are fixed on the islands 16-1 and 16-2, the bonding can be correctly effected if the positions thereof are once determined. After this, the other ends of the lead portions of the first lead section 13A are bonded to the inner lead portions of the lead frame 11 and the wiring operation is completed.

According to the above construction and manufacturing method, the following effects (a) to (g) can be attained.

(a) Since the inner lead portions of the lead frame 11 are connected to the electrode pads formed on the semiconductor chips 12-1 and 12-2 via the wiring pattern 13A formed on the flexible resin tape 14, the mounting can be effected at a higher density than in a case wherein the connection is made by use of the wire bonding.

(b) Since the semiconductor chips 12-1 and 12-2 are connected to each other via the wiring pattern 13B formed on the flexible resin tape 14 so as to constitute a circuit by use of the plurality of chips 12-1 and 12-2, a plastic packaged semiconductor device for the MCP can be obtained by use of the TAB technique.

(c) Since the semiconductor chips 12-1 and 12-2 are mounted on the islands 16-1 and 16-2 of the lead frame 11 formed of material with high heat conductivity, the thermal resistance can be reduced, the heat radiation efficiency can be enhanced and the limitation imposed on the type of applicable semiconductor devices can be alleviated.

(d) Since the lead frame 11 is used and the mechanical strength of the outer lead section is higher than in a case wherein the TAB technique is used, it becomes unnecessary to use a special mounting device on the user's side, the flexibility can be enhanced and the cost of an instrument using the semiconductor device will not be raised.

(e) The semiconductor chips 12-1 and 12-2 are 10 transfer-molded in the resin package 15 so that the excellent hermetic sealing can be attained and the reliability thereof can be made high.

(f) Since a plurality of semiconductor chips 12-1 and 12-2 can be connected to one another in substantially the linear form by means of the wiring patterns 13A and 13B formed on the flexible resin tape 14, the wiring can be made short so as to reduce the impedance component and the electrical characteristic such as the operation speed can be enhanced.

(g) Since a plurality of semiconductor chips 12-1 and 12-2 are connected to one another by means of the wiring patterns 13A and 13B formed on the flexible resin tape 14, the design and assembling thereof can be made simple and the manufacturing cost can be reduced in comparison with a case wherein a printed wiring board is mounted on the island of the lead frame and a plurality of chips are connected to one another via the printed wiring board and bonding wires.

FIG. 4 shows the cross sectional structure of a semiconductor device according to a second embodiment of this invention. In this embodiment, chips 26-1 and 26-2 are formed with different heights (thicknesses). In recent years, portable type personal computers and word processors have become widely used and electronic parts such as semiconductor devices used in the personal computers or word processors are required to be made smaller and thinner. A semiconductor substrate (wafer) with a diameter of 8 inches may be used in the semiconductor device, but the wafer with a large diameter may be easily broken when the thickness thereof is reduced, so that there will be limitations to which the chip thickness is reduced to make the package thinner. Therefore, there may occur much possibility that chips with different thicknesses as in this embodiment are integrated at a high integration density to meet the user's requirements. In order to connect the chips 26-1 and 26-2 with different heights formed on the islands 16-1 and 16-2 of the lead frame 11 to each other via wiring patterns 13A and 13B formed on the resin tape the length L1 of the front end portion of a lead extending into the device hole may be set to be larger than the length L2 of the front end portion connected to the inner lead portion of the lead frame 11 as required. Then, the flexibility of the lead portion 13B can be enhanced and portions with different heights can be easily connected to one another.

With the above structure, short-circuits which may occur when electrode pads which are arranged on a chip at a high density or chips with different thicknesses are connected by wire bonding can be substantially perfectly prevented and the thickness of the package 15 can be reduced.

Figure 5B:
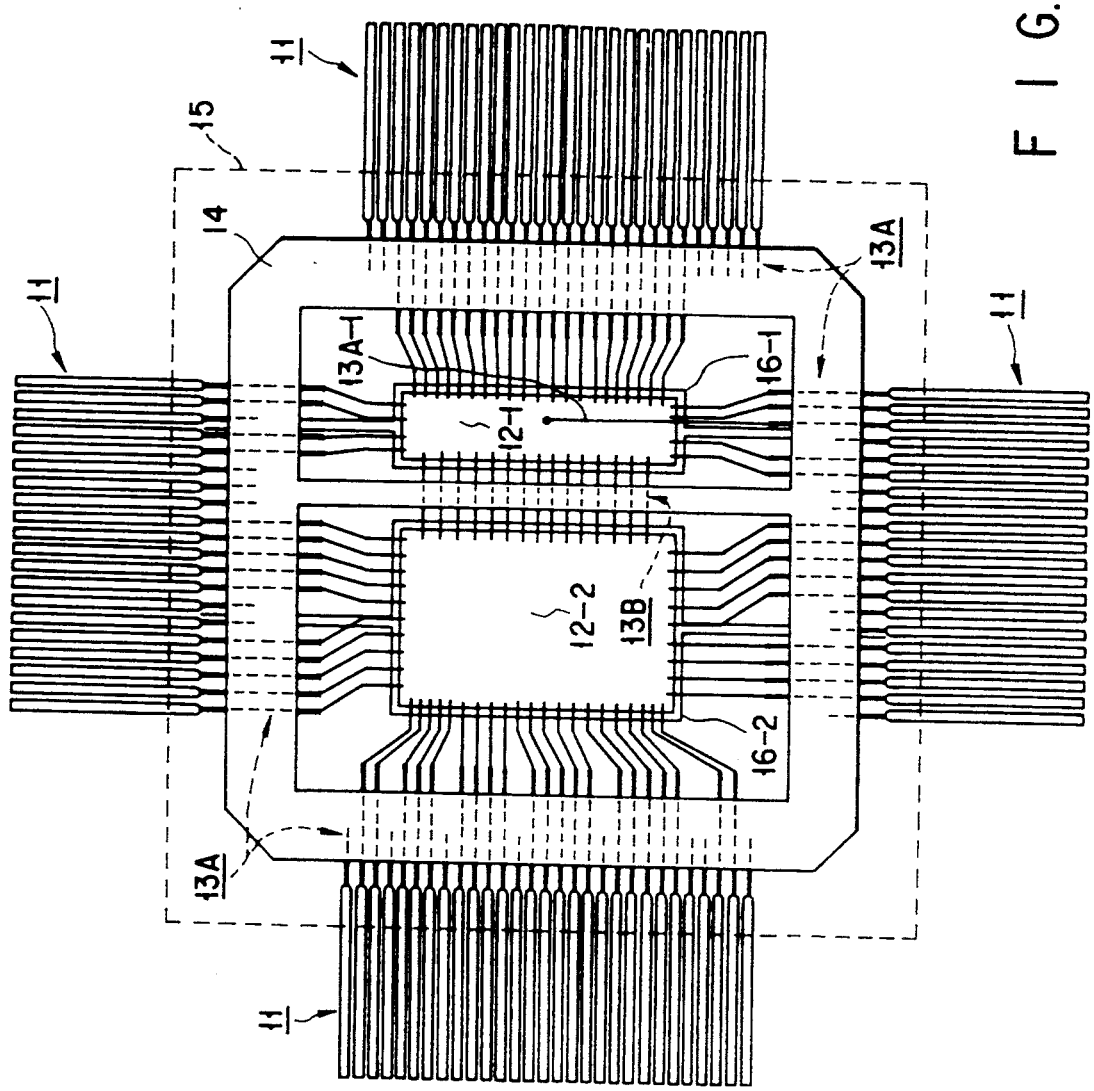
FIG. 5B is a plan view made in perspective of a package, for illustrating the semiconductor device according to the third embodiment of this invention.

FIGS. 5A and 5B show a semiconductor device according to a third embodiment of this invention. FIG. 5A is a cross sectional view of the semiconductor device and FIG. 5B is a plan view made in perspective of the package thereof. Tape carriers (flexible resin tapes) are usually divided into four groups according to the manner in which they are mounted on a printed circuit board. When the surface of the chip on which the bump electrodes are formed is set to face in a direction opposite to that of the front surface of the printed circuit board, it is called a face-up type, and when the surface of the chip on which the bump electrodes are formed is set to face in the same direction as the front surface of the printed circuit board, it is called a face-down type. Further, when the resin tape is set on the front surface of the wiring pattern, it is called a tape-up type and when the resin tape is set on the rear surface of the wiring pattern, it is called a tape-down type. The former two types and the latter two types are combined to make four different mounting manners. In the third embodiment, the face-up/tape-up type is used. That is, those surfaces of the chips 12-1 and 12-2 mounted on the respective islands 16-1 and 16-2 of the lead frame 11 on which the bump electrodes are formed are set to face in a direction opposite to that of the front surface of a printed circuit board (not shown) and the resin tape 14 is placed on the front surfaces of the wiring patterns 13A and 13B.

The feature of the third embodiment is that one-side ends of the lead portions of the lead section 13A are all connected to the respective inner lead portions of the lead frame 11, but some of the lead portions of the lead section 13A are cut off on the half way and are not connected to neither the chip 12-1 nor the chip 12-2.

The reason why some of the lead portions are cut off on the half way is to enhance the flexibility of the resin tape 14 and the wiring patterns 13A and 13B. In this case, the same resin tape 14 and the same wiring patterns 13A and 13B can be used for semiconductor devices requiring different wiring patterns by previously forming a large number of wiring patterns and selectively using desired ones of the wiring patterns 13A and 13B. Further, it is possible to form dummy bump electrodes which are not connected to an internal circuit on the chips 12-1 and 12-2 and connect the other ends of the lead portions which are not used to the dummy bump electrodes. In this case, there will be no lead portion which is cut off on the half way.

The lead portions 13B connecting the chips 12-1 and 12-2 to each other may be unnecessary in some circuit constructions, and in this case, it is not necessary to form the lead portions 13B. Further, it is also possible to extend a lead portion 13A-1 which is one of the lead portions of the lead section 13A into a deep portion of the device hole as shown in FIG. 5B and connect the same to a bump electrode formed on the central portion (or a desired portion) on the chip 12-1. The above construction is particularly suitable for driving the motor of a printing portion in a word processor or personal computer. This is because a large current will usually flow into this type of driving circuit and consequently a large amount of heat will be generated. Since the generation of heat gives a large influence on elements such as control circuits which will not generate heat even in a 5 mm square silicon chip, it becomes necessary to design the circuit and arrange the elements so as to suppress the influence on the elements to minimum. Therefore, influence on the other circuit can be suppressed by disposing the bump electrode of an element which generates heat in a portion apart from another bump electrode and near the center of the chip, for example.

Next, a fourth embodiment of this invention is explained with reference to FIG. 6. In this embodiment, a single lead portion 13A-2 is bonded to a plurality of bump electrodes 17-1, 17-2 and 17-3 formed on a chip 12-2. In this example, three bump electrodes are provided and the lead portion 13A-2 is formed to be longer than the other lead portions of the lead section 13A to constitute the above construction. When the three bump electrodes 17-1, 17-2 and 17-3 are all set at the same potential, for example, at the ground (GND) potential, or when the same signal is input to the three bump electrodes, the occupied area of the wiring may be made smaller when a single lead portion is used than when three lead portions are used. Thus, the semiconductor device can be further miniaturized.

FIG. 7 shows the cross sectional structure of a semiconductor device according to a fifth embodiment of this invention. In each of the above embodiments, one chip is mounted on one island, but in this embodiment, a plurality of chips 12-1 and 12-2 are mounted on one island 16. In FIG. 7, two chips are mounted but three or more chips may be mounted on one chip. However, in this condition, the chips 12-1 and 12-2 are shortcircuited to each other, and therefore, an insulation layer 27 is formed on the island 16 and the chips 12-1 and 12-2 are formed on the insulation layer 27. The insulation layer 27 may be formed of ceramic such as aluminum nitride or alumina or it may be formed of heat-resistant resin such as polyimide.

Figure 8:
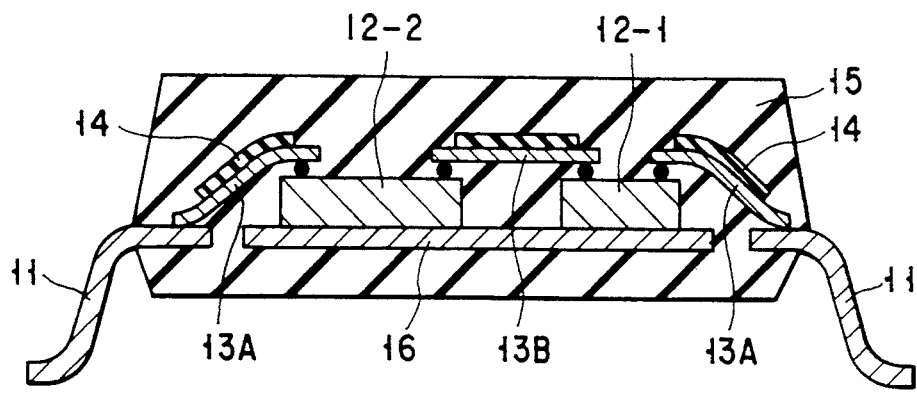
FIG. 8 is a cross sectional view of a semiconductor device according to a sixth embodiment of this invention.

If the chips 12-1 and 12-2 mounted on the island 16 are set in the same condition, for example, in the grounded condition, the insulation layer 27 can be omitted as shown in FIG. 8. Further, it is possible to enhance the integration density of an MCP type semiconductor device by forming islands on each of which one chip is mounted together with islands on each of which a plurality of chips are mounted.

Figure 9:
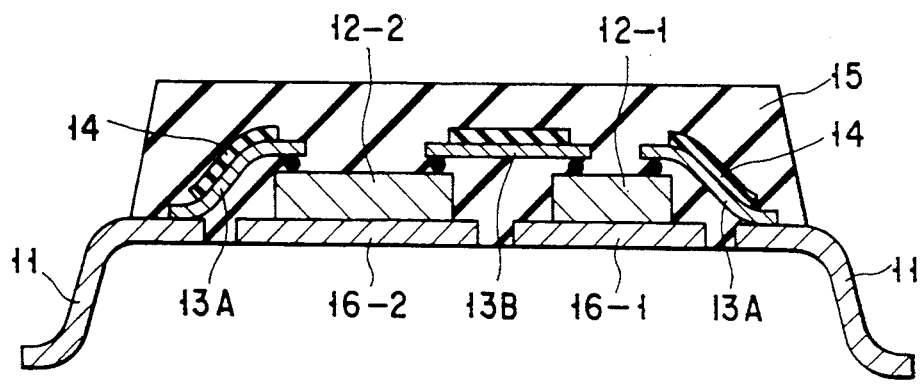
FIG. 9 is a cross sectional view of a semiconductor device according to a seventh embodiment of this invention.
Figure 10:
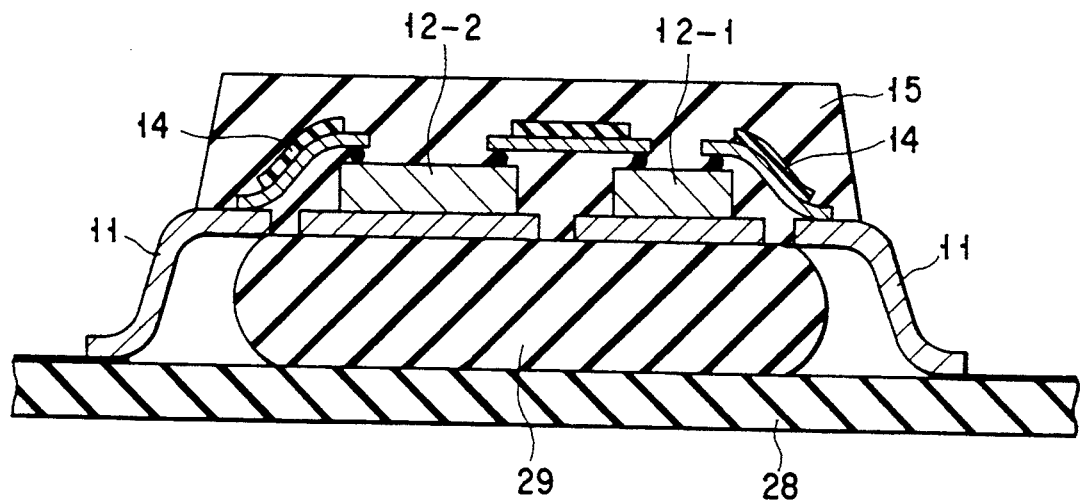
FIG. 10 is a cross sectional view of a semiconductor device according to an eighth embodiment of this invention.
Figure 11:
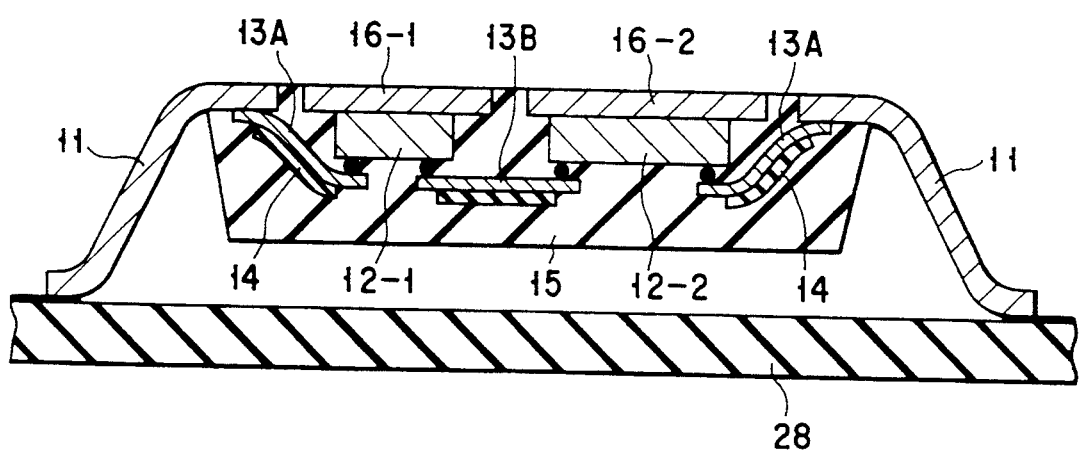
FIG. 11 is a cross sectional view of a semiconductor device according to a ninth embodiment of this invention.
Figure 12:
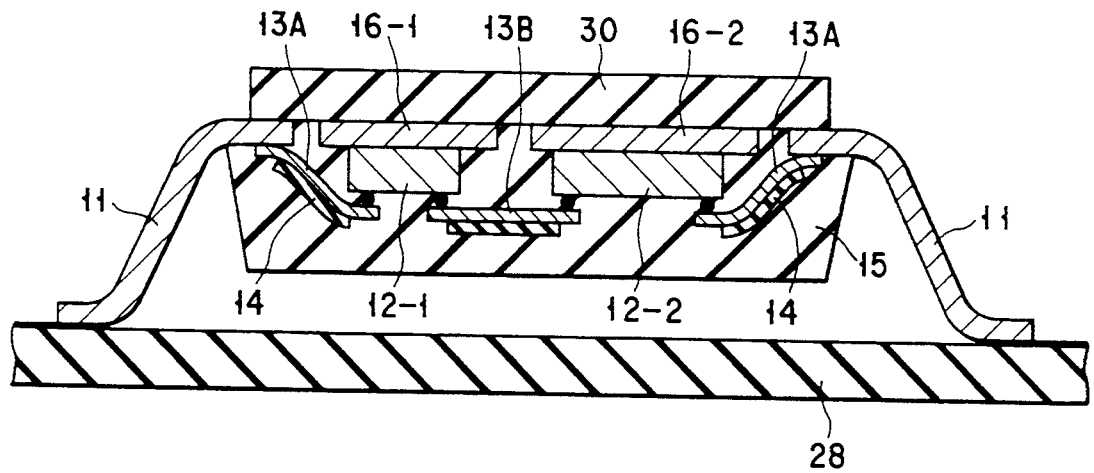
FIG. 12 is a cross sectional view of a semiconductor device according to a tenth embodiment of this invention.

FIG. 9 shows the cross sectional structure of a semiconductor device according to a seventh embodiment of this invention. In this embodiment, the lower portions of the lead frame 11 and the islands 16-1 and 16-2 are exposed in order to enhance the heat radiation efficiency. That is, the resin tape 14 on which the wiring patterns 13A and 13B are formed, the chips 12-1 and 12-2, the inner lead portions, and the islands 16-1 and 16-2 are sealed in a resin package 15. However, the rear surfaces of the islands 16-1 and 16-2 on which the chips 12-1 and 12-2 are not formed are exposed from the package 15. With the above structure, the heat radiation efficiency can be significantly enhanced. Therefore, the above device can be applied to a power semiconductor element which can be used in the motor driving circuit and generates a large amount of heat. In order to enhance the heat radiation efficiency, it is preferable to provide a gap between a printed circuit board (not shown) and the islands 16-1 and 16-2. When much attention is paid to the fixation of the package 15 rather than the heat radiation, adhesive resin 29 may be inserted into a gap between the package 15 and the printed circuit board 28 as shown in FIG. 10. Further, the outer lead portions of the lead frame 11 may be bent in a direction opposite to that shown in FIGS. 9 and 10 or in an upward direction to set the islands 16-1 and 16-2 exposed as shown in FIG. 11 in the upper position. With this structure, since the surfaces of the chips 12-1 and 12-2 on which the bump electrodes 17 are formed are set to face the printed circuit board 28 and the resin tape 14 is set on the under surface of the wiring patterns 13A and 13B, the semiconductor device is called a face-down/tape-down type device. In this type, since the islands 16-1 and 16-2 are arranged on the uppermost portion, the heat radiation efficiency can be further enhanced by mounting a heat sink 30 on the islands 16-1 and 16-2 as shown in FIG. 12.

Figure 13:
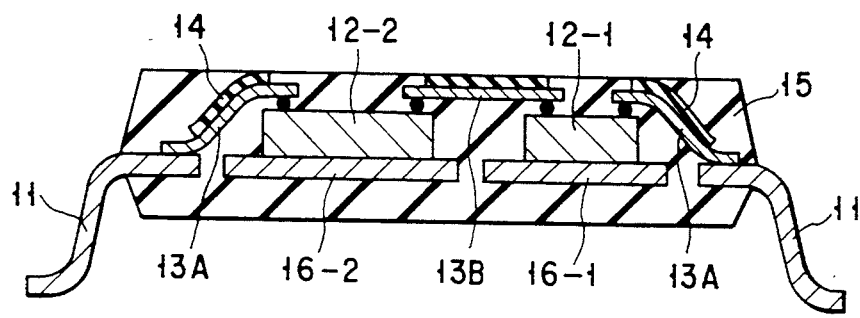
FIG. 13 is a cross sectional view of a semiconductor device according to a eleventh embodiment of this invention.

A semiconductor device according to an eleventh embodiment is explained with reference to FIG. 13. The semiconductor device is of face-up/tape-up type. The islands 16-1 and 16-2 are exposed in the embodiment of FIG. 9, but in the eleventh embodiment, a resin tape 14 disposed on the wiring patterns 13A and 13B is partly exposed. With this structure, since the resin package 15 can be made thin, it becomes possible to reduce the thickness of the semiconductor device.

Figure 14A:
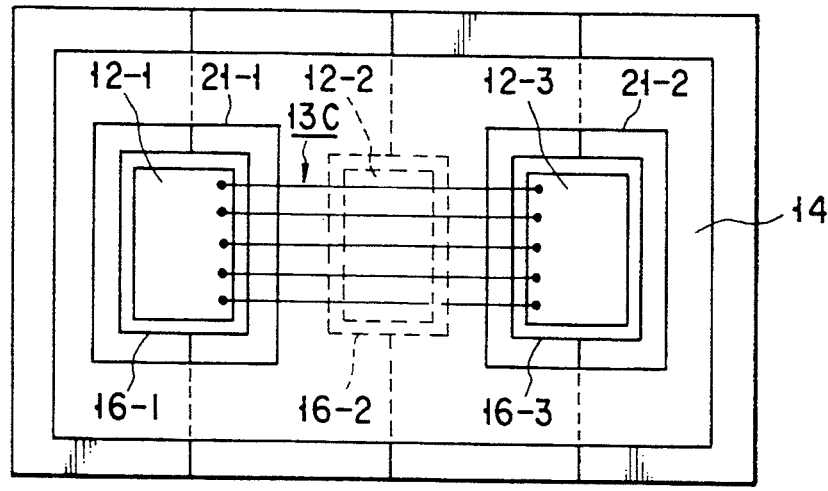
FIG. 14A is a plan view showing a main portion of a semiconductor device according to a twelfth embodiment of this invention.
Figure 14B:
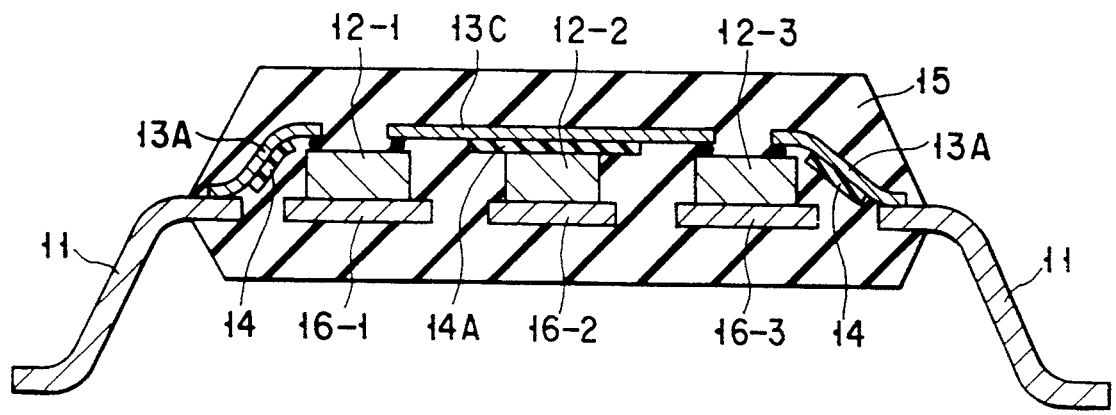
FIG. 14B is a cross sectional view for illustrating the semiconductor device according to the twelfth embodiment of this invention.

FIGS. 14A and 14B show a semiconductor device according to a twelfth embodiment of this invention. FIG. 14A is a plan view showing a main portion of a semiconductor structure obtained before it is sealed into a resin package 15 and FIG. 14B is a cross sectional view showing a completed semiconductor device obtained after the semiconductor structure is sealed into the resin package 15. In this embodiment, when chips are connected to each other, two chips 12-1 and 12-3 are connected to each other via lead portions extending over a chip 12-2 which lies between the chips 12-1 and 12-3. Device holes 21-1 and 21-2 are formed in the resin tape 14 in positions corresponding to the chips 12-1 and 12-3 and no device hole is formed in position corresponding to the chip 12-2. Thus, part 14A of the resin tape 14 is disposed on the chip 12-2 which is not used for the connection and lead portions 13C are laid on the tape 14A so that the chips 12-1 and 12-3 which are disposed in separated positions so as not to be short-circuited can be electrically connected to each other via the lead portions 13C.

In the above embodiment, the wiring for the chip 12-2 may be made after disposing another resin tape under the resin tape 14. Since the wiring patterns of different resin tapes are permitted to cross one another by superposing a plurality of resin tapes on one another, the wiring can be made at the shortest distance.

Figure 15A:
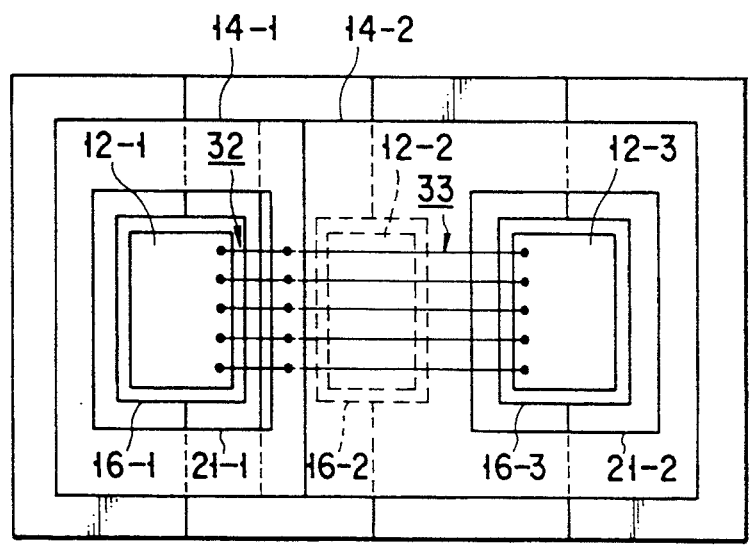
FIG. 15A is a plan view showing a main portion of a semiconductor device according to a thirteenth embodiment of this invention.
Figure 15B:
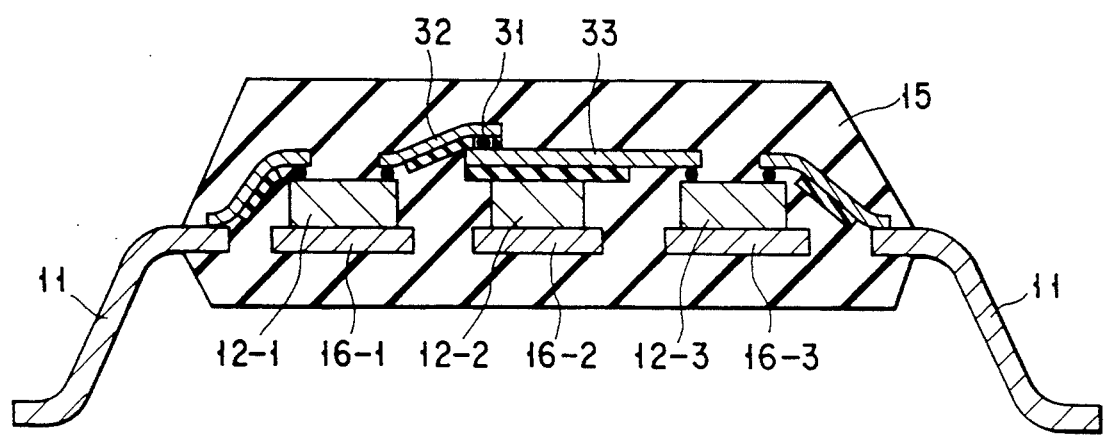
FIG. 15B is a cross sectional view for illustrating the semiconductor device according to the thirteenth embodiment of this invention.

FIGS. 15A and 15B show a semiconductor device according-to a thirteenth embodiment of this invention. Like the twelfth embodiment, in this embodiment, when chips are connected to one another, two chips 12-1 and 12-3 are connected to each other via lead portions extending over a chip 12-2 which lies between the chips 12-1 and 12-3. Further, in this embodiment, two resin tapes 14-1 and 14-2 in which device holes 21-1 and 21-2 are respectively formed are partly overlapped. A through hole is formed in the overlapped portion of the resin tape 14-1 and bump electrodes 31 are formed in the through hole so as to reach the rear surface of the tape, and thus lead portions 32 and 33 are electrically connected to one another.

With the above structure, the chips 12-1 and 12-3 which are disposed in separated positions can be connected to each other by using a conventional type tape carrier. Thus, the chips which are disposed at distant portions can be easily electrically connected by partly overlapping a plurality of resin tapes.

This invention is not limited to the above-described embodiments and can be variously modified. For example, it is not necessary to use the wiring patterns formed on the flexible resin tape to make the connection between the lead frame and the chip or the connection between the chips, but it is possible to use the wire bonding for part of the wiring. Further, it is not necessary to form bump electrodes on the chip, but it is possible to form bump electrodes on the surface of the lead portion lying on the chip side or on both portions. It is also possible to make the front end of the bump electrode sharp.

What is claimed is:

1. A semiconductor device manufacturing method comprising:
   a first step of mounting a plurality of semiconductor chips on at least one island formed on a lead frame;
   a second step of disposing a flexible resin tape on said lead frame, said resin tape having a plurality of device holes formed in positions corresponding to mounting positions of said semiconductor chips and also having a wiring pattern for electrically connecting an inner lead portion of the lead frame to electrode pads of the semiconductor chips;
   a third step of connecting one end of said wiring pattern formed on said flexible resin tape to the electrode pads formed on said plurality of semiconductor chips; and
   a fourth step of connecting the another of said wiring pattern formed on said flexible resin tape to an inner lead section of said lead frame.

2. A semiconductor device manufacturing method according to claim 1, wherein said third step if effected by use of bump electrodes formed on said electrode pads.

3. A semiconductor device manufacturing method according to claim 1, wherein said fourth step is effected by use of alloy bonding.

4. A semiconductor device manufacturing method according to claim 1, wherein said wiring pattern is formed on the surface of said flexible resin tape such that the one end portion of the wiring pattern projects outside of said flexible resin tape with the other end portion projecting into said device holes.

5. A semiconductor device manufacturing method comprising:
   a first step of mounting a plurality of semiconductor chips on at least one island formed on a lead frame;
   a second step of disposing a flexible resin tape on said lead frame, said resin tape having a plurality of device holes formed in positions corresponding to mounting positions of said semiconductor chips, having a first wiring pattern for electrically connecting an inner lead portion of the lead frame to electrode pads of the semiconductor chips, and also having a second wiring pattern for interconnection of the electrode pads of said plurality of semiconductor chips;
   a third step of connecting one end of said first wiring pattern formed on said flexible resin tape to the electrode pads formed on said plurality of semiconductor chips;
   a fourth step of connecting said second wiring pattern formed on said flexible resin tape to the electrode pads formed on said plurality of semiconductor chips so as to electrically connect said semiconductor chips to one another; and
   a fifth step of connecting another end of said first wiring pattern formed on said flexible resin tape to an inner lead section of said lead frame.

6. A semiconductor device manufacturing method according to claim 5, wherein said third and fourth steps are effected by use of bump electrodes formed on said electrode pads.

7. A semiconductor device manufacturing method according to claim 5, wherein said fifth step is effected by use of alloy bonding.

8. A semiconductor device manufacturing method according to claim 5, wherein said first wiring pattern is formed on the surface of said flexible resin tape such that the one end portion of the wiring pattern projects outside of said flexible resin tape with the other end portion projecting into said device hole, and said second wiring pattern is formed on the surface of said flexible resin tape such that one end portion of the second wiring pattern projects into said device holes, with another end portion of the second wiring pattern projecting outside of said flexible resin tape.

* * * * *